United States Patent [19]

Spence

[11] Patent Number: 4,488,266

[45] Date of Patent: Dec. 11, 1984

[54] LOW-POWER ADDRESS DECODER

[75] Inventor: John R. Spence, Villa Park, Calif.

[73] Assignee: Rockwell International Corporation, El Segundo, Calif.

[21] Appl. No.: 426,469

[22] Filed: Sep. 29, 1982

[51] Int. Cl.$^3$ ............................................. G11C 13/00
[52] U.S. Cl. ..................................... 365/189; 365/230; 307/449
[58] Field of Search ................. 307/449; 365/189, 230

[56] References Cited

U.S. PATENT DOCUMENTS

3,665,473  5/1972  Heimbigner ................... 340/166 FE
3,806,880  4/1974  Spence ............................ 340/172.5

Primary Examiner—Terrell W. Fears
Attorney, Agent, or Firm—H. Fredrick Hamann; S. Alfred Uchizono

[57] ABSTRACT

A low-power address decode logic circuit capable of and a method for decoding input address signals and for providing appropriate output address driver signals for retrieving selectively contents stored in memory. A first chargeable device connected to a first node is charged to provide that node with a logic high voltage level during the first of three successive time intervals, is allowed to remain charged or is discharged to provide a logic low voltage level on the first node in accordance with the decoded output of an input NOR gate which decodes the input address signals, while simultaneously gating to an output bootstrap driver a portion of the charge stored on the first chargeable device to cause a desired logic state voltage level to be stored in the driver during the second time interval, and using this logic state voltage level stored in the driver to bootstrap control the output address driver signal during the third time interval. The circuit and method are particularly adaptable for use in decoding input address signals shard between two or more memories, typically a ROM and a RAM.

19 Claims, 3 Drawing Figures

LOW-POWER ADDRESS DECODER

FIELD OF THE INVENTION

This invention is an improved structure and method for a low-power address decoder circuit for providing address driver signals to retrieve selectively contents stored in memory in response to encoded input address signals.

BACKGROUND OF THE INVENTION

In the microcomputer field, it is often advantageous to have as many as possible of the primary functions of computing located on a single chip. Because of the desirability to minimize the area occupied and power dissipated by circuits implementing these functions, a design approach which meets these criteria presents significant advantages over more conventional approaches. Therefore low-power circuits or parts of circuits which can perform a dual function are particularly desirable. One-chip microcomputers usually contain read-only memory (ROM) and random-access memory (RAM). These memories are often addressed by the same address terms which makes it possible to share part of the address decoding structure. Such a structure is described in U.S. Pat. No. 3,806,880 to Spence entitled Multiplexing System for Address Decode Logic, assigned to Rockwell International, assignee of the present invention.

Heretofore, N-channel microcomputers have utilized so-called "static" logic techniques, which tend to consume relatively high power. A desired feature of short ROM and RAM access times, further requires decoding schemes which also tend to consume relatively large amounts of power. Thus, the subject invention relates to an improved address decoder circuit, particularly adaptable to a N-channel single-chip microcomputer, in which the decoder logic is shared between two memories, typically a ROM and a RAM, and in which the decoder circuit utilizes so-called "ratioless" logic techniques resulting in relatively low-power consumption.

SUMMARY OF THE INVENTION

The subject invention is an address decode logic circuit capable of and a method for decoding input address signals and for providing appropriate output address driver signals for retrieving selectively contents stored in memory. The circuit is particularly adaptable for use as a decoder shared between two or more memories, typically a ROM and a RAM.

The principle of operation is conveniently described with reference to a sequence of successive first, second, and third time intervals. A chargeable device connected to a node is charged to give that node a logic high voltage level during the first time interval. During the second interval, the input address signals are decoded by a NOR gate to provide a means for either maintaining the logic high voltage condition or reducing the node voltage to a level corresponding to a logic low condition by controlling a discharge path for the chargeable device, while simultaneously gating to an output bootstrap driver, a portion of the charge stored on the first chargeable device to cause a desired logic state voltage level to be stored in the driver during the second time interval, and, subsequently to use this logic state voltage level stored in the driver to bootstrap control the output address driver signal during the third time interval.

In a further embodiment, and particularly for use with a single-chip microcomputer having a ROM and RAM, two bootstrap drivers are provided, one for the ROM and one for the RAM. Because of typically different address driver requirements, the ROM and RAM bootstrap drivers can be different.

DESCRIPTION OF THE PREFERRED EMBODIMENT

Figure 1:
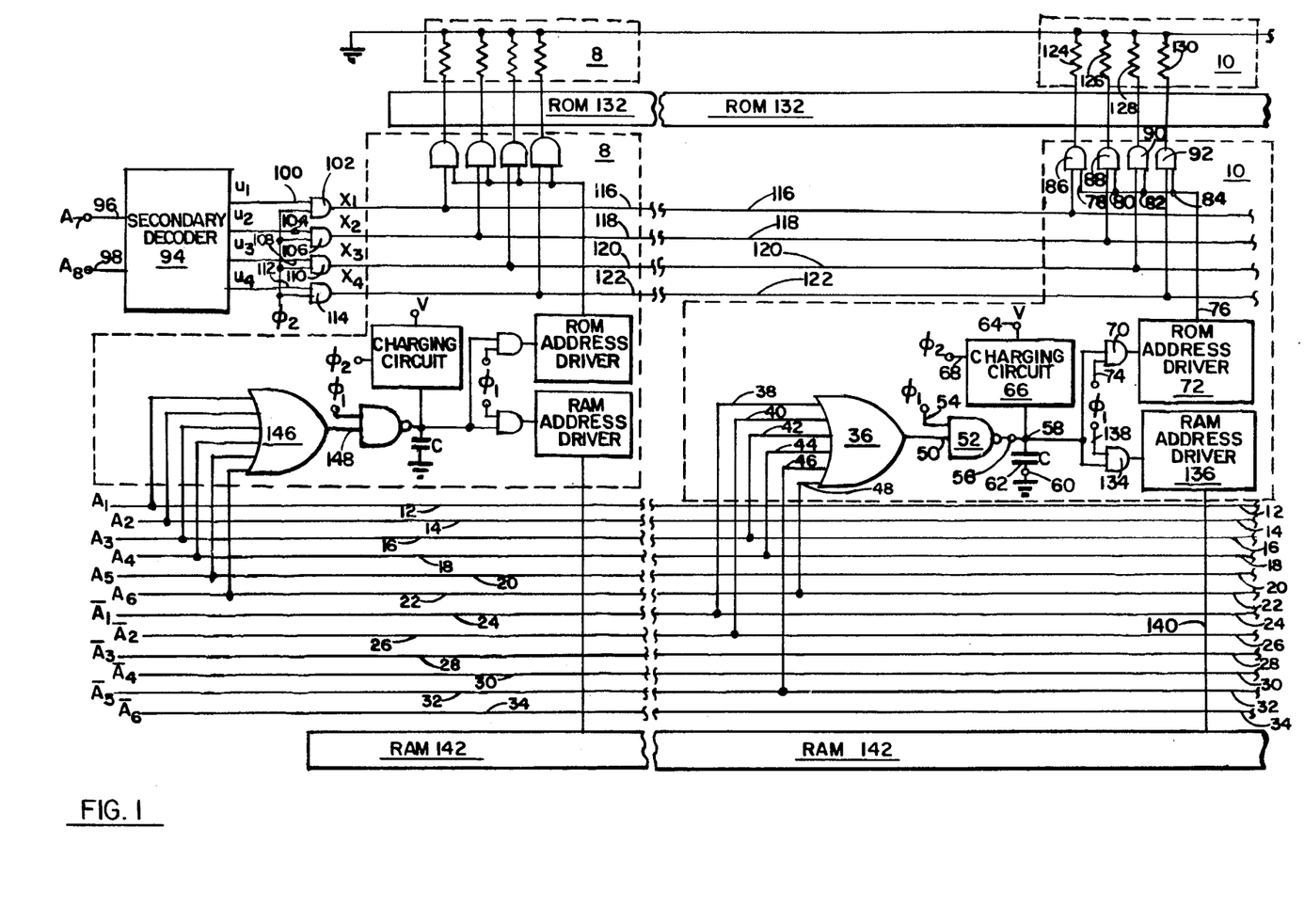
FIG. 1 is a block diagram of a preferred embodiment of the subject invention.
Figure 2:
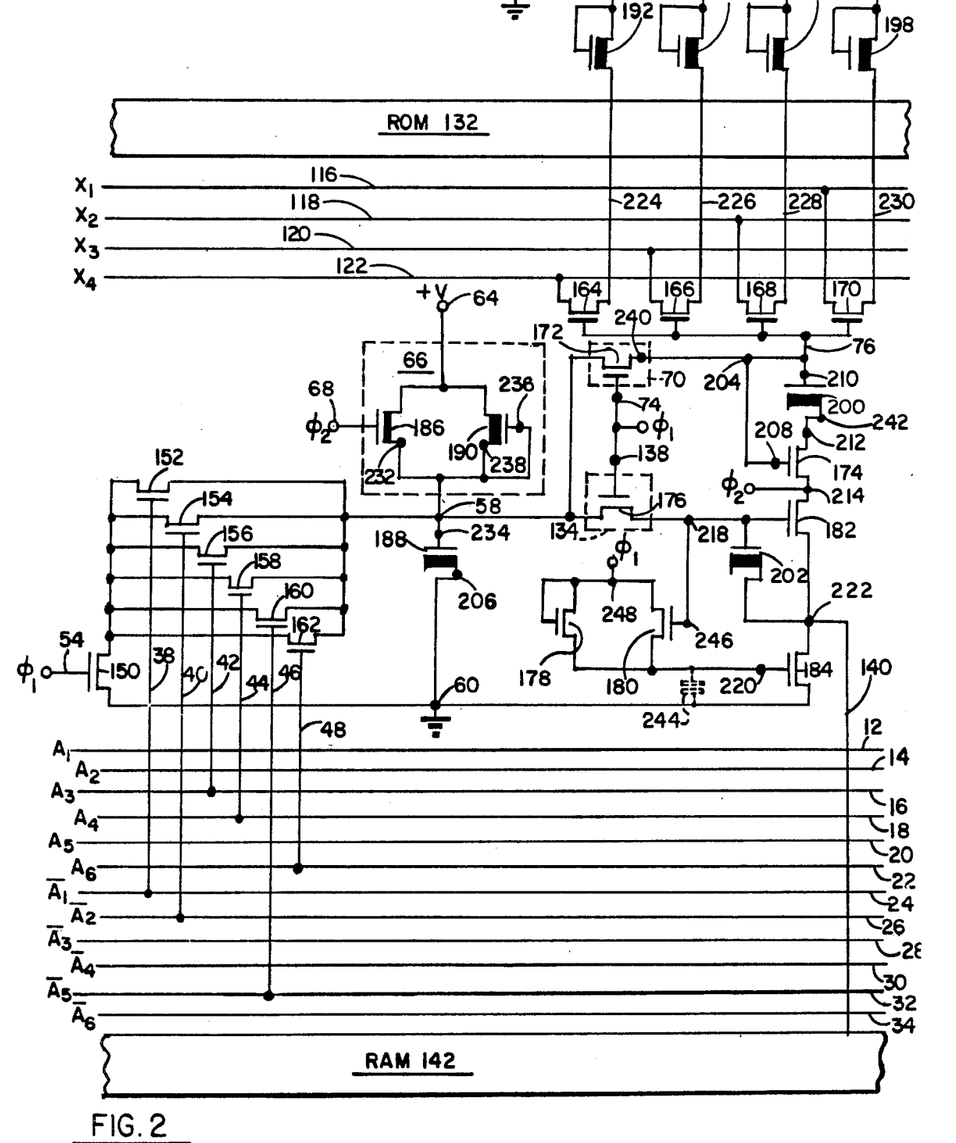
FIG. 2 is a schematic arrangement of a typical decoder section of the preferred embodiment of FIG. 1.

With reference to FIG. 1, this description of the preferred embodiment is by way of presenting a larger scale picture of how each decoder section operates in the framework of the overall decoder configuration to decode input signals and to then generate the corresponding address driver signals. A more detailed description of the circuit is presented hereinbelow with reference to FIGS. 2 and 3. In FIG. 2 a schematic diagram is presented of the circuit for the decoder section 10 of FIG. 1 which provides driver signals for both ROM and RAM.

For purposes of illustration, the functional aspects of the decoder have been simplified by characterizing certain of the circuit functions by logic element equivalents. In a strict sense, this is a somewhat loose characterization of the actual circuit, but it does provide a compact means of conveying the essential aspects of the invention. To this end the voltage levels corresponding to the logic functions portrayed herein have been idealized to the extent that they are assumed to be values corresponding to either "logic high" or "logic low" conditions, though in actuality some deviation from the ideal exists. Logic symbols are used in FIG. 1 to present the basic logical aspects of the operation of the circuit and do not necessarily reflect the actual values of the voltages present on the various terminals.

In the preferred embodiment of FIG. 1, the address decoder circuit comprises a plurality of decoder sections of which the decoder section 8 shown enclosed in a first disjoint set of dashed borders and decoder section 10 shown enclosed in a second disjoint set of dashed borders are typical examples. For this particular embodiment, there are a total of 64 such decoder sections. The input address signals to be decoded are $A_1$ through $A_6$ shown on signal lines 12, 14, 16, 18, 20 and 22, and the logical complement of these signals $\overline{A}_1$ through $\overline{A}_6$ shown on signal lines 24, 26, 28, 30, 32, and 34. In the decoder section 10, signals $\overline{A}_1$, $\overline{A}_2$, A3, A4, $\overline{A}_5$, and $A_6$ are applied to the input of the OR gate 36 on input lines 38, 40, 42, 44, 46, and 48. If any one or more of the input lines 38, 40, 42, 44, 46, or 48 is in a high state (i.e., high voltage level), the output at 50 will be low. If, however, all six inputs are in a low state (i.e., a low voltage level), the output will be high. The output at 50 is applied to one of the inputs of the NAND gate 52. The timing signal, $\phi_1$, is applied to the other input 54 of NAND gate 52. The output 56 of the NAND gate 52 is connected to node 58. Connected between node 58 and a reference voltage terminal 60, typically ground as is the case here, is a chargeable device symbolized as a capacitor and identified by the letter C at 62. Also connected between node 58 and a supply voltage terminal 64, typically at a voltage level +V, is a charging circuit 66 shown controlled by a second timing signal $\phi_2$ applied to the input at 68. Also shown connected to node 58 through a transmission gate 70 (here symbolized as an AND gate) is a ROM address driver 72. The conduction of the transmission gate 70 is controlled by the timing signal $\phi_1$ applied to input 74. The ROM address driver output 76 is shown connected to inputs 78, 80, 82, and 84 on each of four AND gates 86, 88, 90, and 92, respectively. A second input to each of these four AND gates is a unique signal decoded by a secondary decoder 94 (not a part of the present invention) from input address signals A7 and A8 applied to input lines 96 and 98. The output signals $U_1$, $U_2$, $U_3$, and $U_4$ from the secondary decoder 94 are applied to corresponding AND gates: $U_1$ to input 100 of AND gate 102, $U_2$ to input 104 of AND gate 106, $U_3$ to input 108 of AND gate 110, and $U_4$ to input 112 of AND gate 114. The second input to each of the AND gates 102, 106, 110 and 114 is the second timing signal, $\phi_2$. The outputs from these AND gates, $x_1$ on line 116, $x_2$ on line 118, $x_3$ on line 120, and $x_4$ on line 122, provide the address driver signals to be gated by the signal on the output 76 of the ROM address driver 72 at the gates 86, 88, 90 and 92, respectively. Zero level drive is provided by the depletion load resistors symbolically shown as resistors 124, 126, 128, and 130. The ROM, not a necessary part of the present invention, is shown at 132.

Also shown connected to node 58 through transmission gate 134 (here symbolized as an AND gate) is the RAM address driver 136. The conduction of the transmission gate 76 is controlled by the timing signal $\phi_1$ applied to input 138. The output 140 from the RAM address driver is fed to the RAM 142 at the bottom of the figure. The decode section 8, shown in the left hand portion of FIG. 1, is identical to the decode section 10 with the exception of different connections to the input address lines 12 through 34. This difference in connections permits the decoding of a different address signal upon its receipt on the address lines 12 through 34. Whereas for the singular input combination to decoder section 10, in which the signals $\overline{A_1}$, $\overline{A_2}$, $A_3$, $A_4$, $\overline{A_5}$, and $A_6$, are all in a low state, thereby producing a high output at 50, by contrast in decoder section 8, a high state at the output 148 of the NOR gate 146 is produced only for that singular combination of inputs wherein signals A1 through A6 are all low.

In FIG. 2, a schematic diagram of decoder section 10 is presented. Three different types of field effect transistor (FET) are shown, each type represented by a distinctive symbol. The field effect transistors (FETs) 150–184 are all N-channel enhancement-mode FETs. Transistor 186 is also an N-channel enhancement-mode FET. However, it is characterized by a threshold voltage which is substantially equal to zero volts. The remainder of the FETs 188–202 are N-channel depletion-mode FETs. In FIG. 2, $\phi_1$ and $\phi_2$ symbolize first and second timing signals which define successive first, second and third time intervals, $\tau_1$, $\tau_2$, and $\tau_3$, as shown in the time line diagram of FIG. 3. The circuit of FIG. 2 is operated from a voltage source providing a supply voltage level +V at supply voltage terminal 64 and a reference voltage level (typically at ground) at reference voltage terminal 60. A first node is located at 58 and a second node is located at 204. A chargeable device, depletion-mode FET 188, is connected between the first node 58 and the reference voltage terminal 60. Depletion-mode FET 188 has a gate terminal 234 which is connected to the first node 58 and a conduction path terminal 206 which is connected to the reference voltage terminal 60. Means 66 for charging the chargeable device, FET 188, comprises the zero-threshold voltage enhancement-mode FET 186 and depletion-mode FET 190, connected in parallel between the supply voltage terminal 64 and the first node 58. The timing signal $\phi_2$ is applied to the gate terminal 68 of FET 186 to cause FET 186 to conduct during the first time interval $\tau_1$ (see FIG. 3), such as to produce a voltage level on node 58 substantially equal to the supply voltage level +V, corresponding to a logic high condition. Connected in series between the node 58 and ground (at reference voltage level) are a NOR gate comprised of six enhancement-mode FETs (152, 154, 156, 158, 160, and 162) connected in parallel and a control gate characterized by the enhancement-mode FET 150 for connecting the NOR gate to the reference voltage terminal 60. Input address signals are applied to the gate terminals of each of the NOR gate FETs in a one-to-one relationship as follows: $\overline{A_1}$ to FET 152 through line 38, $\overline{A_2}$ to FET 154 through line 40, $A_3$ to FET 156 through line 42, $A_4$ to FET 158 through line 44, $\overline{A_5}$ to FET 160 through line 46, and $A_6$ to FET 162 through line 48. The conductivity of control gate FET 150 is controlled by the timing signal $\phi_1$ applied to its gate terminal 54, which signal rises to a value of +V during the $\tau_2$ time period. During $\tau_2$, then, FET 150 can conduct allowing the output state of the NOR gate to be manifest in the voltage level of node 58.

Turning now to the ROM driver portion of the decoder section, the transmission gate 70, shown here as FET 172, is shown connected between the first node 58 and the second node 204. During interval $\tau_2$ when the timing signal $\phi_1$ applied to gate terminal 74 is at voltage level V, the FET 172 is in a conducting condition. Also shown connected to node 204 is the gate terminal 208 of FET 174 and the gate terminal 210 of depletion-mode device 200. One conduction path terminal 242 of FET 200 is shown connected to a third node 212. Also shown connected to node 212 is a first conduction path terminal of FET 174. The other conduction path terminal of FET 174 is shown being driven by timing signal $\phi_2$ at 214. The node 204 is also shown connected in parallel through line 76 to the gate terminals of FETs 164, 166, 168, and 170, where a first conduction path terminal of each of these FETs is connected in a one-to-one arrangement to the decoded address lines 116, 118, 120, and 122, respectively, bearing the decoded address signals $x_1$, $x_2$, $x_3$, and $x_4$ previously described with respect to FIG. 1, and where a second conduction path terminal of each of these FETs provides the desired address driver signal to a corresponding ROM location. To provide zero level address driver current, depletion-mode FETs 192, 194, 196, and 198, biased in an on condition, are included in series with the address driver signal lines 224, 226, 228 and 230.

Turning now to the RAM driver portion of the decoder section, the transmission gate 134, shown here as FET 176, is connected between node 58 and a fourth node 218. As with the transmission gate 70 on the ROM side of the configuration, the RAM side transmission gate 134 is also driven by the first timing signal $\phi_1$. When $\phi_1$ goes positive (during time period $\tau_2$) the transmission gate FET 176 can become conductive. Also connected to node 218 are the gate terminals of FETs 180, 202 and 182. The first timing signal $\phi_1$ is also applied to first conduction path terminals of FETs 178 and 180. The gate of FET 178 is also driven by the timing signal $\phi_1$. Second conduction path terminals of FETs 178 and 180 are connected to the gate terminal 220 of FET 184. Connected to a fifth node 222 are one of the conduction path terminals of depletion-mode FET 202, the second conduction path terminal of FET 182, and the first conduction path terminal of FET 184. The second timing signal $\phi_2$ is applied to the first conduction path terminal of FET 182. The second conduction path terminal of FET 184 is returned to ground. The address driver signal for the RAM 142 is provided at node 222. The lead 140 provides this signal.

PRINCIPLE OF OPERATION

Figure 3:
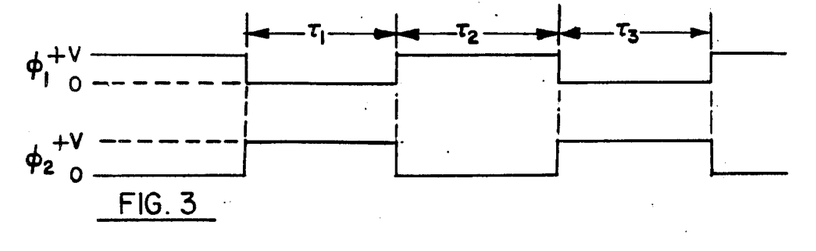
FIG. 3 is a time line diagram showing first and second timing signals used to operate the invention of the preferred embodiment of FIGS. 1 and 2.

In principle of operation of the decoder section of FIG. 2 is related to the sequence of three successive time intervals, $\tau_1$, $\tau_2$, and $\tau_3$ as indicated in FIG. 3. For this configuration, it is assumed that the input signals, $A_1$ through $A_6$ and $\overline{A}_1$ through $\overline{A}_6$, are maintained constant for at least the duration of the second time interval, $\tau_2$.

During the first time interval, $\tau_1$, the overall function of the circuit is to charge the chargeable device, FET 188, to a value approximately equal to the supply voltage level, $+V$. To achieve the timely charging of FET 188, appropriate control over the charging and discharging paths must be maintained, primarily by turning on FET 186 while simultaneously turning off FET 150. Because FET 186 has a threshold voltage which is nearly zero volts (typically around 0.1 volts) conduction occurs when the potential of its gate terminal 31 barely exceeds the potential of its source terminal (conduction path terminal 232) which is connected to node 58. The potential of the FET 186 gate terminal is controlled by the timing signal, $\phi_2$, applied to it. From FIG. 3, the timing signal, $\phi_2$, is at voltage level $+V$ during $\tau_1$, thereby enabling FET 186 to conduct until FET 188 is charged very nearly to $+V$. In addition to the path through FET 186, current will also flow through FET 190 to charge the chargeable device, FET 188. Because FET 190 is a depletion-mode device, it will conduct with zero bias between the gate terminal 236 and the conduction path terminal 238. Such is the case here with gate terminal 236 connected to conduction path terminal 238. Therefore, FET 190 is normally conducting whenever the potential of node 58 is less than $+V$. FET 190 provides additional current to charge FET devices 200 and 202 during the $\tau_2$ time interval. It can be dispensed with by providing a larger charge storage capacity for FET device 188.

To avoid short circuiting the node 58 to ground during this charging interval, the discharge path through the NOR gate comprised of the parallel combination of FETs 152 through 162 in series with FET 150 must be open circuited. To achieve this open circuit condition in this discharge path, one of the following conditions must exist: either FET 150 is not conducting, or all of the FETs 152 through 162 are not conducting, or both. Because each of the FETs 150 through 162 are enhancement-mode FETs, the gate terminal potential must be greater than the threshold voltage for that particular transistor to conduct. Therefore, with a gate terminal potential less than the threshold voltage, particularly, a potential of zero volts, these FETs will not conduct.

Applied to the gate terminal 54 of FET 150 is the timing signal $\phi_1$. From FIG. 3, it is seen that during the time interval $\tau_1$, the signal $\tau_1$ is at zero volts. Therefore, during $\tau_1$ FET 150 is turned off, thereby preventing the connection of node 58 to ground. It is, therefore, immaterial with respect to this discharging path that any of the FETs 152 through 162 is enabled to conduct by the respective address signal being applied to its gate terminal if FET 150 is turned off.

Also during $\tau_1$, the timing signal $\phi_1$ is being applied to the gate terminals 74 and 138 of the FETs 172 and 176, respectively. FETs 172 and 176 are also enhancement-mode FETs. Therefore, a zero potential on the gate terminal 74 and 138 will cause FETs 172 and 176 to be turned off. Since $\phi_1$ is at zero potential during $\tau_1$, FETs 172 and 176 are turned off during $\tau_1$.

At the transition between the time interval $\tau_1$ and $\tau_2$ then, the status of the decoder section is as follows: FET 188 is charged to approximately $+V$ volts; address inputs to be decoded are applied to the NOR gate comprising FETs 152 through 162; FET 186 is being turned off; and FETs 150, 176, and 172 are being turned on. During $\tau_2$, $\phi_1$ is at $+V$ volts and $\phi_2$ is at zero volts. Consequently, FET 150 is conducting and if any one of the NOR gate FETs 152 through 162 is turned on by one of the input address signals, the pre-charged FET 188 is allowed to discharge through the NOR gate and FET 150 to ground. If however, all of the address signals applied to the gate terminals of FETs 152 through 162 are low such that none of these NOR gate FETs is conducting, the charge on FET 188 is not allowed to discharge through the NOR gate and FET 150 path. The charge which is on FET 188 does, however, flow through FETs 172 and 176 to the respective ROM and RAM driver sections as will be described below. Because $\phi_1$ is now at $+V$ volts, both FETs 172 and 176 are allowed to conduct during $\tau_2$. Some of the charge which is on FET 188 is thus distributed amongst the various capacitive elements which lie on the output side of FETs 172 and 176. Because FET 190 is a depletion-mode device, it will conduct additional charge from supply voltage terminal 64 through FETs 172 and 176 to augment charge from FET 188 providing an additional positive voltage margin in presenting a logic high condition to the output driver stages. FET 190 is sized and doped such that, by itself, the amount of charge it provides to the various capacitive elements lying on the output side of FETs 172 and 176 during $\tau_2$ is less than the logic high threshold condition for the output stages. In an optional configuration where layout constraints allow, increasing the capacitance of FET 188 to allow it to hold a larger pre-charge can be traded off for the current capacity of FET 190, to the extent that FET 190 can be eliminated entirely.

Looking at the ROM driver portion of the circuit, charge which is passed through FET 172 is allowed to charge up a second chargeable device, FET 200, connected as a capacitive element with the gate terminal connected to the conduction path terminal 240 of FET 172, node 204, and the gate terminal 208 of FET 174. Typically, the total capacitance of all of the various capacitive elements, such as the FET device 200, which lie on the output side of FETs 172 and 176 is substantially less than the capacitance of the chargeable device FET 188, such that the amount of charge which is removed from FET 188 and used to charge these elements is of a magnitude such that the voltage on node 58 is not reduced significantly. During $\tau_2$, the timing signal $\phi_2$ which is applied to node 214 is at zero volts. Therefore, if the potential of the gate terminal 208 of FET 174 exceeds the threshold voltage of FET 174, FET 174 conducts, thereby providing a charging path for chargeable device, FET 200. If the potential on node 204 during $\tau_2$ is less than the threshold voltage of FET 174, such as may be the case when FET 188 is discharged down through the NOR gate and FET 150 to ground, then sufficient voltage is not available at the gate terminal 208 of FET 174 to turn on FET 174. This being the case, a charging path for chargeable device, FET 200, does not exist and FET device 200 remains uncharged, i.e., no voltage is across FET device 200. Just to summarize briefly what occurs during $\tau_2$ in the ROM driver section, if FET 188 is not discharged through the NOR gate and FET 150 by an input address combination which prevents that discharge, then at the end of the $\tau_2$ time interval, chargeable device, FET 200, will be charged to a voltage slightly less than $+V$. If, however, the NOR gate is allowed to conduct because of the presence of address signals turning on one of the NOR gate FETs, then at the end of the $\tau_2$ time interval, the chargeable device, FET 200, will remain substantially uncharged. As the transition to the time interval $\tau_3$ occurs then, we see from FIG. 3 that timing signal $\phi_1$ returns to zero volts and timing signal $\phi_2$ increases to $+V$ volts. Timing signal $\phi_2$ is applied to the node 214 at one of the conduction path terminals of FET 174. As the potential on node 214 increases from zero to $+V$ volts, the potential on node 212 will increase also if there is adequate voltage across the chargeable device, FET 200. This voltage will have been present on FET 200 if during the previous time interval, $\tau_2$, a charge was transferred to it from FET 188. If such a voltage exists across FET 200, then as $\phi_2$ goes to $+V$ volts the FET 174 will conduct and thereby raise the potential on node 204 to approximately the value of $\phi_2$ plus the voltage across the chargeable device FET 200. For example, if during $\tau_2$ the chargeable device FET 200 were charged to a value of 4 volts, for example, then as $\phi_2$ goes to $+V$ volts, the potential on node 204 will go to approximately $+V$ plus 4 volts. Where V is 5 volts, for example, the potential on node 204 will then increase to approximately 9 volts. It should be noted that during $\tau_3$, FET 172 is turned off such that this bootstrap effect is not dissipated by charge leaking back through FET 172 back on to FET 188. It is noted that node 204 is also connected to the gate terminals of FETs 164, 166, 168, and 170. During $\tau_3$, then, if any of the address lines 116, 118, 120, or 122 is in a high condition, i.e., at some logic high voltage, then the respective FET (one of the FETs 164 through 170) will be controlled into a conducting condition such that current flows from the respective address line up through the driver signal line (one of the lines 224, 226, 228, 230) up through the ROM 132 and thence through one of the FETs 192 through 198 to ground. Because of the manner in which the signals $x_1$, $x_2$, $x_3$, and $x_4$ are decoded from the input address signals $A_7$ and $A_8$ (see FIG. 1 at 96 and 98) only one of the lines 116, 118, 120, and 122 will be high at any given time. Therefore, even though all four of the driver FETs 164, 166, 168, and 170 are enabled to conduct, only one will conduct because only one will have a drain positive with respect to its gate, where the drains of the driver FETs are those conduction path terminals connected to the address lines 116, 118, 120, and 122. To keep the driver lines 224, 226, 228, and 230 from floating, these lines are returned to the reference (ground) level through depletion-mode FETs 192, 194, 196, and 198, respectively. If at the end of the $\tau_2$ time interval, node 204 is at a low level corresponding to a non-data-retrieving condition, then during the time interval $\tau_3$ when the timing signal $\phi_2$ goes to $+V$ volts, the potential on node 204 will remain low since there are no means by which the potential on node 214 can be coupled to node 204. This is because of the absence of a voltage across the FET device 200 wherein the capacitance of the device is related to the voltage across the device. Since the device FET 200 is a field effect device, absent a potential on the gate electrode relative to the conduction path electrodes, the capacitance of the device is minimal, reflecting the extent to which a conductive channel underlies the gate electrode. Because of this minimal capacitance, the potential of node 204 is insignificantly affected by the coupling of $\phi_2$ through FETs 174 and 200. This is to say that even though $\phi_2$ goes to $+V$ volts, the potential of node 204 will remain substantially unchanged. In this case with node 204 at a low level, none of the four driver FETs (164 through 170) will be enabled to conduct regardless of the amplitude of the voltage on lines 116, 118, 120, or 122. This agrees with the desired result since the condition, which gives rise to a low voltage on 204 during the time interval $\tau_2$, corresponds to that input address condition wherein at least one of the input address lines (lines 16, 18, 22, 24, 26, 32) is high, causing the discharge of FET 188 to occur during time interval $\tau_2$. The only condition for which FET 188 does not discharge to a low logic level during the time interval $\tau_2$ is that condition for which the input signals to the NOR gate are all low, i.e., signals $A_3$, $A_4$, $A_6$, $\overline{A}_1$, $\overline{A}_2$, and $\overline{A}_5$, are in a logic low state.

Turning to the RAM driver portion of the decoder section, it is noted that this is a push-pull driver. During the time interval $\tau_2$, $\phi_1$ is at $+V$ and $\phi_2$ is at zero. FET 176 is on. FET 178 is on, causing the stray capacitance 244 to charge up to a voltage level approximately a volt or so less than $+V$. If V is 5 volts, for example, the voltage on the gate terminal of FET 184 at 220 is approximately $+4$ volts causing FET 184 to turn on, thereby pulling the potential of node 222 down towards the reference voltage level of terminal 60. Because $\phi_2$ is at zero, FET 182 is not conducting because of the small voltage across the device. During $\tau_2$ if the logic state is high on FET 188, i.e., the voltage is at approximately $+V$, the charge from FET 188 will be distributed to charge chargeable device FET 202 through the enhancement-mode FET 176 to a voltage slightly less than the originally charged value of FET 188. During the time interval $\tau_3$, $\phi_1$ has now gone to zero and $\phi_2$ is now at $+V$. Therefore, the charge on the stray capacitance will discharge up through FET 180 to terminal 248 (not at zero volts) if the voltage on node 218 and, consequently, the gate terminal 246 of FET 180 exceeds the threshold voltage. The voltage on node 218 will exceed the threshold voltage if the voltage state of FET 188 during the time period $\tau_2$ was such that the chargeable device 202 was charged to a value greater than the threshold voltage of FET 180. If FET 180 is therefore turned on, thereby discharging the stray capacitance 244 to below the threshold value of FET 184, FET 184 will be turned off. In addition, the terminal 214 of FET 182 will be at $+V$ volts. Aside from the drop across FET 182, this potential will be applied to node 222 by the bootstrap action of the charged FET device 202 which will maintain a gate terminal potential above the threshold voltage of the FET 182 to turn on FET 182. In such event then, the potential on node 222 will rise towards the $\phi_2$ level, being somewhat less due to the drop through transistor 182. This signal on node 222, then, is fed to the RAM at 142 through the signal line 140. If instead of a high logic level existing on node 58 during $\tau_2$, a low state exists, then during $\tau_3$, FET 180 will not be turned on because its gate terminal potential which is connected to node 218 will not exceed the threshold voltage value. Therefore, the stray capacitance 244 will not be discharged and FET 184 will remain on, holding the potential of node 222 to very close to the potential of the reference terminal 60. In addition, because chargeable device FET 202 will not be charged sufficiently, FET 182 will not turn on during $\tau_3$ because the potential of the gate does not exceed the threshold value, regardless of the fact that the potential on the terminal 214 is at $+V$. Therefore, under these conditions node 222 will remain at substantially the reference voltage level during $\tau_3$. The RAM address driver signal is provided on line 140 which is connected to node 222.

Thus, in examining the circuitry of FIG. 2, it is seen that for the 12 input address lines, lines 12 through 34, on which six input address signals and their complements are imposed, the overall address decoder is capable of providing address driver signals for 64×4 or 256 ROM addresses when combined with the four address signals $x_1$, $x_2$, $x_3$, and $x_4$. In addition, 64 RAM address driver signals are available from output terminals similar to node 222. Referring back to FIG. 1, this means that there are 64 address decoder sections such as are depicted in 8 and 10, wherein the address inputs are connected differently to each of the 64 address decoder sections. To further distinguish between whether the ROM or the RAM is being addressed, further multiplexing (not shown) can be implemented at the memory output level using well known commutating techniques.

In examining the diagrams of FIG. 1 and FIG. 2, it is seen that the decoder section is adaptable to be used as an address decoder for one or more memories. In the example given hereinabove, two memories, a ROM and a RAM, are addressed by the address decoder circuit.

Although the invention has been described and illustrated in detail, it is to be clearly understood that the same is by way of illustration and example only and is not to be taken by way of limitation, the spirit and scope of this invention being limited only by the terms of the appended claims.

I claim:

1. A low-power address decoder circuit for providing an address driver signal to retrieve selectively content stored in memory in response to a plurality of input address signals and to first and second timing signals defining successive first, second, and third time intervals, said circuit adapted to operate from a voltage source providing supply and reference voltage levels at supply and reference voltage terminals, respectively, said circuit comprising:

first and second nodes;
a chargeable device connected between said first node and said reference voltage terminal;
means connected to said first node for charging said chargeable device during said first time interval to produce a voltage level on said first node corresponding to a logic high condition substantially equal to said supply voltage level;
a NOR gate having a plurality of address inputs adapted to receive and decode said plurality of input address signals and also having a gated output connected to said first node for maintaining said logic high condition thereon during said second time interval if retrieval is decoded and discharging said chargeable device to produce a voltage level on said first node corresponding to a logic low condition otherwise;
means for gating said NOR gate output to said first node in response to said first timing signal during said second interval;
transmission gate means connected between said first and second nodes for connecting conductively said first and second nodes to each other in response to said first timing signal to establish a unique voltage level on said second node during said second time interval corresponding to said voltage level on said first node;
a bootstrap driver responsive to said unique voltage level on said second node for providing bootstrapped control during said third time interval of said unique voltage level on said second node established during said second time interval; and
memory cell driver means connected to said second mode and controlled by said bootstrap controlled voltage level thereon for providing an address driver signal to retrieve selectively content stored in memory during said third time interval.

2. The decoder circuit of claim 1 wherein said chargeable device comprises a N-channel depletion-mode field effect transistor (FET) having a gate terminal connected to said first node and also having a conduction path terminal connected to said reference voltage terminal.

3. The decoder circuit of claim 1 wherein said means for charging said chargeable device comprises:

a N-channel enhancement-mode field effect transistor (FET) characterized by a threshold voltage substantially equal to zero and also having a gate terminal and first and second conduction path terminals; and
a N-channel depletion-mode field effect transistor (FET) having a gate terminal and first and second conduction path terminals;
said enhancement mode FET and said depletion-mode FET being connected in parallel between said supply voltage terminal and said first node; said depletion-mode FET gate terminal connected to said first node; and said second timing signal being applied to said enhancement-mode FET gate terminal.

4. The decoder circuit of claim 1 wherein said means for gating said NOR gate output to said first node comprises a N-channel enhancement-mode field effect transistor (FET) responsive to said first timing signal and connected in series with said NOR gate between said first node and said reference voltage terminal.

5. The decoder circuit of claim 1 wherein:

said means for gating said NOR gate output to said first node comprises a first N-channel enhancement-mode field effect transistor (FET) responsive to said first timing signal and connected in series with said NOR gate between said first node and said reference voltage terminal; and
said transmission gate means comprises a second enhancement mode field effect transistor (FET) connected between said first and second nodes responsive to said first timing signal.

6. The decoder circuit of claim 1 wherein said bootstrap driver comprises:
a third node;
a N-channel enhancement-mode field effect transistor (FET) having a gate terminal connected to said second node and having first and second conduction path terminals, said first conduction path terminal being connected to said third node; said second timing signal being applied to said second conduction path terminal; and
a N-channel depletion-mode field effect transistor (FET) having a gate terminal connected to said second node and a conduction path terminal connected to said third node.

7. The decoder circuit of claim 1 in which said memory cell driver means comprises a plurality of N-channel enhancement-mode field effect transistors (FETs) responsive to said bootstrap-controlled voltage level.

8. The decoder circuit of claim 1 wherein said bootstrap driver comprises:
a third node;
a N-channel depletion-mode field effect transistor (FET) having a gate terminal connected to said second node and a conduction path terminal connected to said third node; and
first, second, third, and fourth N-channel enhancement-mode field effect transistors (FETs), each of said enhancement mode FETs having a gate terminal and first and second conduction path terminals;
said bootstrap driver further characterized by said first timing signal being applied to said gate terminal of said first enhancement-mode FET and first conduction path terminals of said first and second enhancement-mode FETs; gate terminals of said second and third enhancement-mode FETs being connected to said second node; said second conduction path terminal of said first and second enhancement-mode FETs being connected to said gate terminal of said fourth enhancement-mode FET; said second timing signal being applied to said first conduction path terminal of said third enhancement-mode FET; said second conduction path terminal of said third enhancement-mode FET and said first conduction path terminal of said fourth enhancement-mode FET being connected to said third node; and said second conduction path terminal of said fourth enhancement-mode FET being connected to said reference voltage terminal, whereby said control signal to retrieve selectively contents stored in memory is provided at said third node.

9. A low-power address decoder circuit for providing address driver signals to retrieve contents of selected memory locations in response to a first set of unique input address signals and a further set of address signals derived from a second set of unique input address signals and to first and second timing signals defining successive first, second, and third time intervals, said circuit adapted to operate from a voltage source providing supply and reference voltage levels at supply and reference voltage terminals, respectively, said circuit comprising:
first and second nodes;
a chargeable device connected between said first node and said reference voltage terminal;
means connected to said first node for charging said chargeable device to produce a voltage level corresponding to a logic high condition on said first node substantially equal to said supply voltage level during said first time interval;
a NOR gate having a plurality of address inputs adapted to receive and decode said first set of unique input address signals and also having a gated output connected to said first node for maintaining said logic high condition thereon if retrieval is decoded and for discharging said chargeable device to produce a voltage level corresponding to a logic low condition on said first node otherwise;
means for gating said NOR gate output to said first node in response to said first timing signal during said second time interval;
transmission gate means connected between said first and second nodes for connecting conductively said first and second nodes to each other during said second time interval in response to said first timing signal to establish a unique voltage level on said second node corresponding to said voltage level on said first node;
a bootstrap driver responsive to said unique voltage level on said second node established during said second time interval for providing bootstrap control of said unique voltage level on said second node during said third time interval; and
a plurality of gated memory cell drivers connected to said second node and controlled by said bootstrap controlled voltage level thereon for providing address driver signals to retrieve contents of selected memory locations during said third time interval; each address driver signal being gated by said second timing signal and a dedicated member of said further set of address signals.

10. The decoder circuit of claim 9 wherein:
said chargeable device comprises a first N-channel depletion-mode field effect transistor (FET) having a gate terminal connected to said first node and having a conduction path terminal connected to said reference voltage terminal;
said means for charging said first chargeable device comprises a N-channel enhancement-mode field effect transistor (FET) characterized by a threshold voltage substantially equal to zero and having a gate terminal and first and second conduction path terminals; and
said means for charging said first chargeable device further comprises a second N-channel depletion-mode field effect transistor (FET) having a gate terminal and first and second conduction path terminals;
said means for charging said first chargeable device further characterized by said enhancement-mode FET and said second depletion-mode FET being connected in parallel between said supply voltage terminal and said first node; said second timing signal being coupled to said gate terminal of said enhancement-mode FET; and said gate terminal of said second depletion-mode FET being connected to said first node.

11. The decoder circuit of claim 9 wherein:
said bootstrap driver comprises a third node;
said bootstrap driver further comprises a N-channel enhancement-mode field effect transistor (FET) having a gate terminal connected to said second node and having first and second conduction path terminals, said first conduction path terminal being connected to said third node and said second timing signal being applied to said second conduction path terminal;

said bootstrap driver also comprises a N-channel depletion-mode field effect transistor (FET) having a gate terminal connected to said second and also having a conduction path terminal connected to said third node; and said plurality of gated memory cell drivers comprises a plurality of further N-channel enhancement-mode field effect transistors (FETs), each member of said plurality of further FETs having a gate terminal and first and second conduction path terminals, said gate terminal of each member of said plurality of further FETs connected to said second node, members of said further set of address signals being applied to said first conduction path terminals of members of said plurality of further FETs in a one-to-one relationship, and said second conduction path terminals of members of said plurality of further FETs providing said address driver signals to retrieve contents of selected memory locations.

12. The decoder circuit of claim 9 wherein:

said chargeable device comprises a first N-channel depletion-mode field effect transistor (FET) having a gate terminal connected to said first node and also having a conduction path terminal connected to said reference voltage terminal;

said means for charging comprises a first N-channel enhancement-mode field effect transistor (FET) characterized by a threshold voltage substantially equal to zero and having a gate terminal and first and second conduction path terminals;

said means for charging further comprises a second N-channel depletion-mode field effect transistor (FET) having a gate terminal and first and second conduction path terminals;

said means for charging further characterized by said first enhancement-mode FET and said second depletion-mode FET being connected in parallel between said supply voltage terminal and said first node, said second timing signal being applied to said first enhancement-mode FET gate terminal, and said second depletion-mode FET gate terminal being connected to said first node;

said bootstrap driver comprises a third node;

said bootstrap driver further comprises a second N-channel enhancement-mode field effect transistor (FET) having a gate terminal connected to said second node and also having first and second conduction path terminals, said first conduction path terminal being connected to said third node and said second timing signal being applied to said second conduction path terminal;

said bootstrap driver also comprises a third N-channel depletion-mode field effect transistor (FET) having a gate terminal connected to said second node and also having a conduction path terminal connected to said third node; and said plurality of gated memory cell drivers comprises a plurality of further N-channel enhancement-mode field effect transistors (FETs), each member of said plurality of further FETs having a gate terminal and first and second conduction path terminals, said gate terminal of each member of said plurality of further FETs being connected to said second node, members of said further set of address signals being applied to said first conduction path terminals of members of said plurality of further FETs in a one-to-one relationship, and said second conduction path terminals of members of said plurality of further FETs providing said address driver signals to retrieve contents of selected memory locations.

13. A low-power shared address decoder circuit for providing address driver signals to retrieve selectively contents of ROM and RAM memory locations in response to a first set of unique input address signals and a further set of address signals derived from a second set of unique input address signals and to first and second timing signals defining successive first, second, and third time intervals, said circuit adapted to operate from a voltage source providing supply and reference voltage levels at supply and reference voltage terminals, respectively, said circuit comprising:

first, second, and third nodes;

a chargeable device connected between said first node and said reference voltage terminal;

means connected to said first node for charging said chargeable device to produce a voltage level corresponding to a logic high condition on said first node substantially equal to said supply voltage level during said first time interval;

a NOR gate having a plurality of address inputs adapted to receive and decode said first set of unique input address signals and also having a gated output connected to said first node for maintaining said logic high condition thereon if retrieval is decoded and for discharging said first chargeable device to produce a voltage level on said first node corresponding to a logic low condition otherwise;

means for gating said NOR gate output to said first node in response to said first timing signal during said second interval;

first transmission gate means connected between said first and second nodes for connecting conductively during said second time interval in response to said first timing signal said first and second nodes to each other to establish a unique voltage level on said second node corresponding to said voltage level on said first node;

a first bootstrap driver responsive to said unique voltage level on said second node established during said second time interval for providing bootstraped control of said unique voltage level on said second node during said third time interval;

a plurality of gated ROM address drivers connected to said second node and controlled by said bootstrap controlled voltage level thereon for providing said address driver signals to retrieve contents of selected ROM memory locations during said third time interval, each address driver signal being gated by said second timing signal and a dedicated member of said further set of address signals;

second transmission gate means connected between said first and third nodes of said circuit for connecting conductively said first and third nodes to each other to establish a unique voltage level on said third node corresponding to said voltage level on said first node in response to said first timing signal during said second interval; and a second bootstrap driver responsive to said unique voltage level on said third node established during said second time interval for providing bootstrapped control of said unique voltage level on said third node during said third time interval, said second bootstrap driver further providing said address driver signal to retrieve content of selected RAM memory location.

14. The shared address decoder circuit of claim 13 wherein said chargeable device comprises a first N-channel depletion-mode field effect transistor (FET) having a gate terminal connected to said first node and also having a conduction path terminal connected to said reference voltage terminal.

15. The decoder circuit of claim 14 wherein said means for charging said chargeable device comprises:
a first N-channel enhancement-mode field effect transistor (FET) characterized by a threshold voltage substantially equal to zero and having a gate terminal and first and second conduction path terminals; and
a second N-channel depletion-mode field effect transistor (FET) having a gate terminal and first and second conduction path terminals;
said first enhancement-mode FET and said second depletion-mode FET being connected in parallel between said supply voltage terminal and said first node; said second timing signal being applied to said first enhancement mode FET gate terminal; and said second depletion-mode FET gate terminal being connected to said first node.

16. The decoder circuit of claim 15 wherein said first bootstrap driver comprises:
a fourth node;
a second N-channel enhancement-mode field effect transistor (FET) having a gate terminal connected to said second node and also having first and second conduction path terminals, said first conduction path terminal being connected to said fourth node and said second timing signal being applied to said second conduction path terminal; and
a third N-channel depletion-mode field effect transistor (FET) having a gate terminal connected to said second node and also having a conduction path terminal connected to said fourth node.

17. The decoder circuit of claim 16 wherein:
said second bootstrap driver comprises a fifth node;
said second bootstrap driver further comprises a fourth N-channel depletion-mode field effect transistor (FET) having a gate terminal connected to said second node and also having a conduction path terminal connected to said fifth node; and
said second bootstrap driver also comprises third, fourth, fifth, and sixth N-channel enhancement-mode field effect transistors (FETs), each of said third through sixth enhancement-mode FETs having a gate terminal and first and second conduction path terminals;
said second bootstrap driver further characterized by said first timing signal being applied to said gate and first conduction path terminals of said third enhancement-mode FET and to said first conduction path terminal of said fourth enhancement-mode FET; said gate terminal of each of said fourth and fifth enhancement-mode FETs being connected to said third node; said second conduction path terminals of each of said third and fourth enhancement-mode FETs being connected to said gate terminal of said sixth enhancement-mode FET; said second timing signal being applied to said first conduction path terminal of said fifth enhancement-mode FET; said second conduction path terminal of said fifth enhancement-mode FET being connected to said fifth node; said second conduction path terminal of said sixth enhancement mode FET being connected to said reference voltage terminal; and said first conduction path terminal of said sixth enhancement mode FET being connected to said fifth node, whereat said address driver signal to retrieve content of selected RAM location is provided.

18. The decoder circuit of claim 17 in which said plurality of gated ROM address drivers comprises a plurality of further N-channel enhancement-mode field effect transistors (FETs), each member of said plurality of further FETs having a gate terminal and first and second conduction path terminals, said gate terminal of each member of said plurality of further FETs being connected to said second node, members of said further set of address signals being applied to said first conduction path terminals of members of said plurality of further FETs in a one-to-one relationship, and said second conduction path terminals of members of said plurality of further FETs providing said address driver signals to retrieve selectively contents of ROM memory locations.

19. Method of address decoding for a semiconductor memory using a low-power address decoder circuit comprising the steps of:
charging a chargeable device connected between a first node of said circuit and a first reference level terminal to produce a voltage level corresponding to a logic high condition on said first node during a first time interval;
decoding multiple input address signals using a NOR gate during a second time interval to produce a voltage level on said first node corresponding to a logic high condition if the memory address corresponding to said NOR gate is to be queried, and to produce a voltage level corresponding to a logic low condition otherwise;
discharging said chargeable device during said second time interval when the NOR gate produces a voltage level on said first node corresponding to a logic low condition; and
gating the voltage level present on said first node to bootstrap driver means during said second time interval to provide a logic high condition on the control terminal of switch means of the memory cell to be queried during a third time interval.

* * * * *

UNITED STATES PATENT AND TRADEMARK OFFICE
CERTIFICATE OF CORRECTION

PATENT NO. : 4,488,266
DATED : December 11, 1984
INVENTOR(S) : John R. Spence

It is certified that error appears in the above-identified patent and that said Letters Patent are hereby corrected as shown below:

Column 6, line 3, please change "$\tau_1$" to read --$\phi_1$"--.

Column 10, line 26, please change "mode" to read --node--.

Signed and Sealed this

Thirtieth Day of April 1985

[SEAL]

Attest:

DONALD J. QUIGG

Attesting Officer  Acting Commissioner of Patents and Trademarks